(12) United States Patent
Park

(10) Patent No.: US 7,208,406 B2
(45) Date of Patent: Apr. 24, 2007

(54) METHOD FOR FORMING GATE IN SEMICONDUCTOR DEVICE

(75) Inventor: Kye-Soon Park, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 106 days.

(21) Appl. No.: 10/879,777

(22) Filed: Jun. 28, 2004

(65) Prior Publication Data
US 2005/0142809 A1  Jun. 30, 2005

(30) Foreign Application Priority Data
Dec. 24, 2003  (KR) .................. 10-2003-0096314

(51) Int. Cl.
*H01L 21/4763* (2006.01)
(52) U.S. Cl. .................. 438/633; 438/259; 438/631; 438/595; 438/700
(58) Field of Classification Search ................ 438/197, 438/211, 230, 585, 588, 303, 267, 523, 587, 438/270, 631, 633, 259, 348, 366–367, 595–596, 438/639, 645, 696–697, 700, 702
See application file for complete search history.

(56) References Cited

U.S. PATENT DOCUMENTS

| 6,277,707 B1 | 8/2001 | Lee et al. | |
| 6,566,216 B1 | 5/2003 | Takahashi | |
| 6,660,591 B2 | 12/2003 | Peake et al. | |
| 6,762,102 B2 * | 7/2004 | Kasuya | 438/287 |
| 6,777,812 B2 * | 8/2004 | Lee et al. | 257/773 |
| 6,797,564 B1 * | 9/2004 | Wu et al. | 438/257 |
| 6,849,519 B2 * | 2/2005 | Dong | 438/424 |
| 6,897,115 B2 * | 5/2005 | Cho et al. | 438/259 |
| 7,012,335 B2 * | 3/2006 | Lee et al. | 257/758 |
| 2003/0017667 A1 * | 1/2003 | Park et al. | 438/243 |
| 2003/0119323 A1 * | 6/2003 | Park | 438/692 |

OTHER PUBLICATIONS

ASC9: 90 nm CMOS Process Technology, 4 pages.
Intel Technology Journal, vol. 8, iss. 2, May 10, 2004, 3 pages.

* cited by examiner

*Primary Examiner*—Zandra V. Smith
*Assistant Examiner*—Thanh Y. Tran
(74) *Attorney, Agent, or Firm*—Blakely Sokoloff Taylor & Zafman

(57) ABSTRACT

Disclosed is a method for forming a gate in a semiconductor device. The method includes the steps of: sequentially forming a gate insulation layer and an inter-layer insulation layer on a substrate; patterning the inter-layer insulation layer into a predetermined configuration, thereby forming a patterned inter-layer insulation layer; forming a nitride layer on the patterned inter-layer insulation layer; simultaneously etching the nitride layer and the substrate, thereby obtaining a spacer on sidewalls of the patterned inter-layer insulation layer and a trench having a predetermined depth in the substrate; forming a conductive layer on the trench; and planarizing the conductive layer, thereby forming the gate.

5 Claims, 6 Drawing Sheets

METHOD FOR FORMING GATE IN SEMICONDUCTOR DEVICE

FIELD OF THE INVENTION

The present invention relates to a method for fabricating a semiconductor device; and, more particularly, to a method for forming a gate in a semiconductor device.

DESCRIPTION OF RELATED ARTS

A large-scale of integration of a semiconductor device has led to a gradual decrease in the design rule which subsequently causes a pitch between gates to be decreased. Under consideration of transistor characteristics such as a short channel effect and a refresh characteristic, Designers currently attempt to increase a line width of a gate while decreasing the pitch between gates.

FIGS. 1A and 1B are cross-sectional views for describing a conventional method for forming a gate in a semiconductor device.

Referring to FIG. 1A, a field oxide layer 11 is formed in a substrate 10, thereby defining an active region of the substrate 10. Then, a gate insulation layer 12 is formed on a substrate structure including the substrate 10 and the field oxide layer 11. A polysilicon layer 13 and a first tungsten layer 14 are sequentially deposited on the gate insulation layer 12 to form a gate structure. Afterwards, a nitride layer 15 and a second tungsten layer 16 are sequentially formed on the first tungsten layer 14. A photoresist pattern 18 is formed on the second tungsten layer 16. The photoresist pattern 18 is formed by performing a photolithography process with use of a gate mask.

Herein, the nitride layer 15 and the second tungsten layer 16 serve as a hard mask. The second tungsten layer 16 is an etch barrier layer for preventing the nitride layer 15 from being etched away during a subsequent etching process for forming a gate structure.

Referring to FIG. 1B, the second tungsten layer 16, the nitride layer 15, the first tungsten layer 14 and the polysilicon layer 13 shown in FIG. 1A are sequentially etched by using the photoresist pattern as a mask.

Although not illustrated in FIG. 1B, this etching process proceeds in two steps. Firstly, the second tungsten layer 16 and the nitride layer 15 are etched by using the photoresist pattern 18 as the mask, and then, the photoresist pattern 18 is stripped away. Secondly, a gate 100 including a patterned tungsten layer 14A and a patterned polysilicon layer 13A is formed by another etching process by using a nitride hard mask 15A as a mask. As mentioned above, in order to protect the nitride hard mask 15A from being etched away during the formation of the gate 100, there is formed an additional hard mask, i.e., a tungsten hard mask (not shown) obtained as a result of the first etching process and etched away during the formation of the gate 100.

After the formation of the gate 100, a spacer nitride layer 19 is formed on an entire surface of the above resulting substrate structure to cover the gate 100 and the nitride hard mask 15A.

However, a gradual decrease in a pitch between the gates 100 which has led to an increase in an aspect ratio, results in several adverse effects. For instance, there may be frequent occurrences of the loading effect which causes the photoresist pattern 18 to be collapsed, and a bridge fail may be created due to remnants still remaining after the gate 100 is formed.

FIG. 2 illustrates a problem that might arise during the formation of a conventional gate structure. Herein, the same elements shown in FIGS. 1A and 1B are denoted with the same reference numbers and their detailed descriptions on such elements are omitted. After the formation of the spacer nitride layer 19, an inter-layer insulation layer 20 is formed on the resulting substrate structure including the gate 100 and the spacer nitride layer 19 to insulate spaces between the gates 100. However, there might be generated voids 200 in the inter-layer insulation layer 20 allocated between the gates 100. These voids, however, might induce a dual-bit failure. As a result, there is a limitation in increasing a line width of the gate up to a certain level within a defined pitch between the gates. Accordingly, it is difficult to obtain a good transistor characteristic in a highly integrated semiconductor device.

SUMMARY OF THE INVENTION

It is, therefore, an object of the present invention to provide a method for forming a gate in a semiconductor device capable of obtaining a good transistor characteristic by securing a sufficient pitch between the gates and simultaneously maximizing a line width of the gate within a defined pitch between the gates.

In accordance with an aspect of the present invention, there is provided a method for forming a gate in a semiconductor device, including the steps of: sequentially forming a gate insulation layer and an inter-layer insulation layer on a substrate; patterning the inter-layer insulation layer into a predetermined configuration, thereby forming a patterned inter-layer insulation layer; forming a nitride layer on the patterned inter-layer insulation layer; simultaneously etching the nitride layer and the substrate, thereby obtaining a spacer on sidewalls of the patterned inter-layer insulation layer and a trench having a predetermined depth in the substrate; forming a conductive layer on the trench; and planarizing the conductive layer, thereby forming the gate.

In accordance with another aspect of the present invention, there is provided a semiconductor device, including: a substrate; a plurality of gate insulation layers formed on the substrate; at least one barrier metal layer formed between and below the gate insulation layers in the form of a curved line; and at least one metal layer formed on the barrier metal layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, a preferred embodiment of the present invention will be described in detail with reference to the accompanying drawings.

FIGS. 3A to 3E are cross-sectional views for describing a method for forming a gate in a semiconductor device in accordance with a preferred embodiment of the present invention.

Figure 1A:
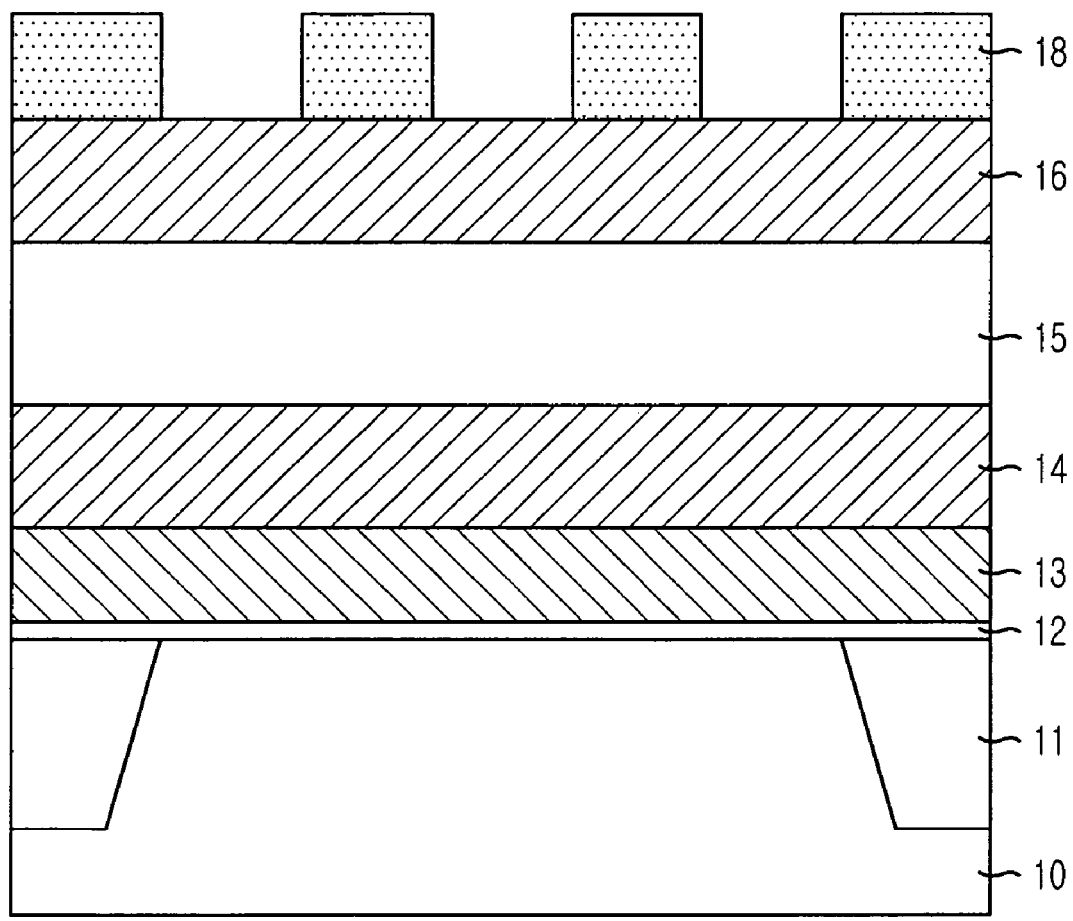
FIGS. 1A and 1B are cross-sectional views for describing a conventional method for forming a gate in a semiconductor device.
Figure 1B:
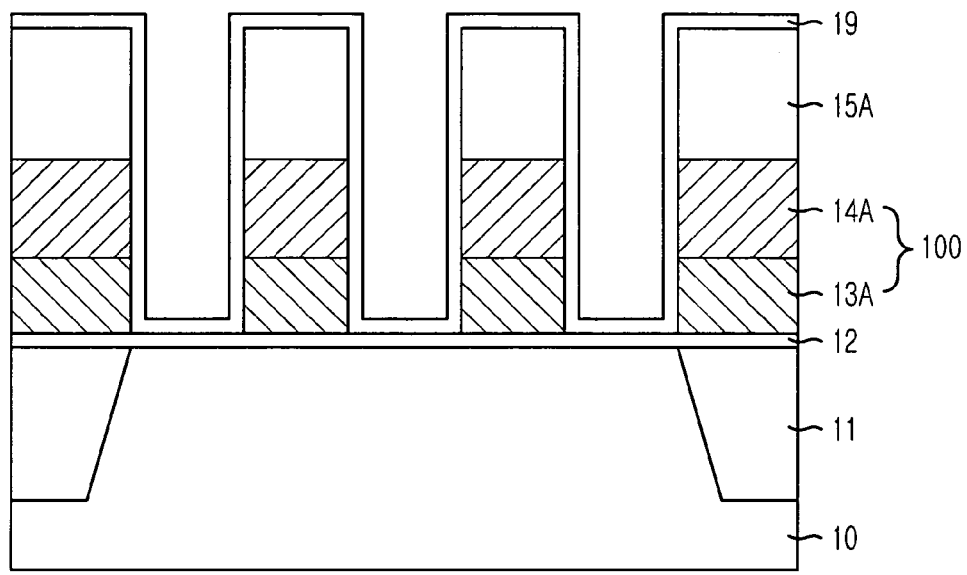
Figure 2:
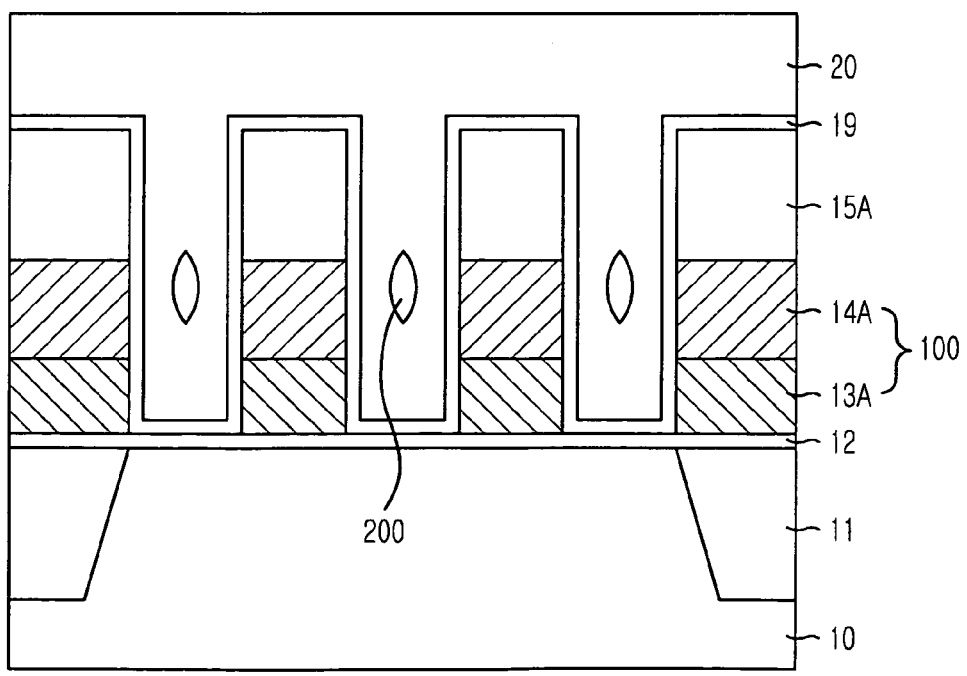
FIG. 2 is a cross-sectional view of a conventional semiconductor device in which voids are generated in an inter-layer insulation layer deposited after a gate is formed.
Figure 3A:
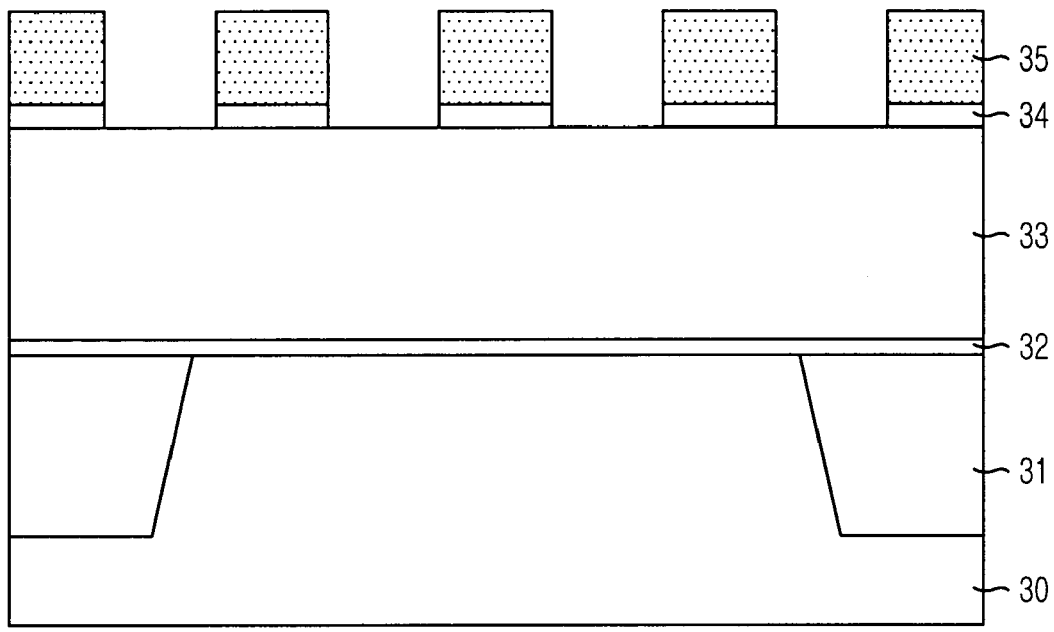
FIGS. 3A to 3E are cross-sectional views for describing a method for forming a gate in a semiconductor device in accordance with a preferred embodiment of the present invention.

Referring to FIG. 3A, a field oxide layer 31 is formed in a substrate 30, thereby defining an active region. Then, a gate insulation layer 32 is formed on the substrate 30 and the field oxide layer 31, and an inter-layer insulation layer 33 which is made of oxide is formed on the gate insulation layer 32. Afterwards, instead of forming a line-type photoresist pattern which is typically used in a conventional method, a space-type photoresist pattern 35 is formed on the inter-layer insulation layer 33 by performing a photolithography process. Herein, the space-type photoresist pattern 35 is formed in a manner which is inverse to forming a conventional line-type photoresist. That is, when the conventional line-type photoresist pattern is used, an intended structure is formed beneath a region where the photoresist pattern existed. In contrast, when the space-type pattern 35 is used, an intended structure is formed beneath a space created between the space-type photoresist patterns 35. Also, it is possible to form a bottom anti-reflective coating (BARC) layer 34 beneath the space-type photoresist pattern 35 to prevent a scattering phenomenon occurring at an interface between the space-type photoresist pattern 35 and the inter-layer insulation layer 33.

Figure 3B:
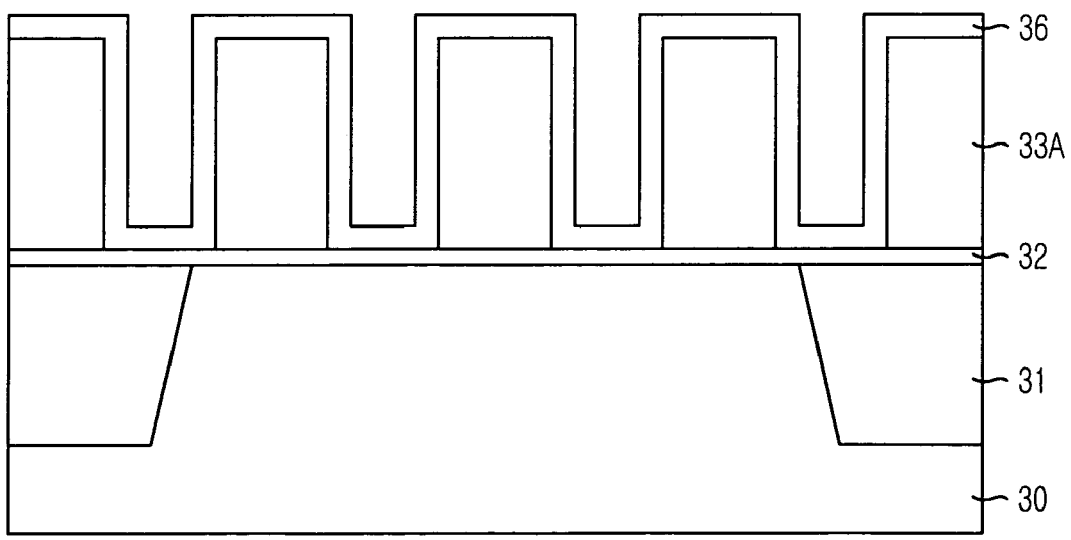

Referring to FIG. 3B, the inter-layer insulation layer 33 is etched with use of the space-type photoresist pattern 35 as an etch mask to form an inter-layer insulation pattern 33A. Thereafter, the space-type photoresist pattern 35 and the BARC layer 34 are removed. A spacer nitride layer 36 is formed on the above resulting substrate structure to cover the inter-layer insulation pattern 33A.

Figure 3C:
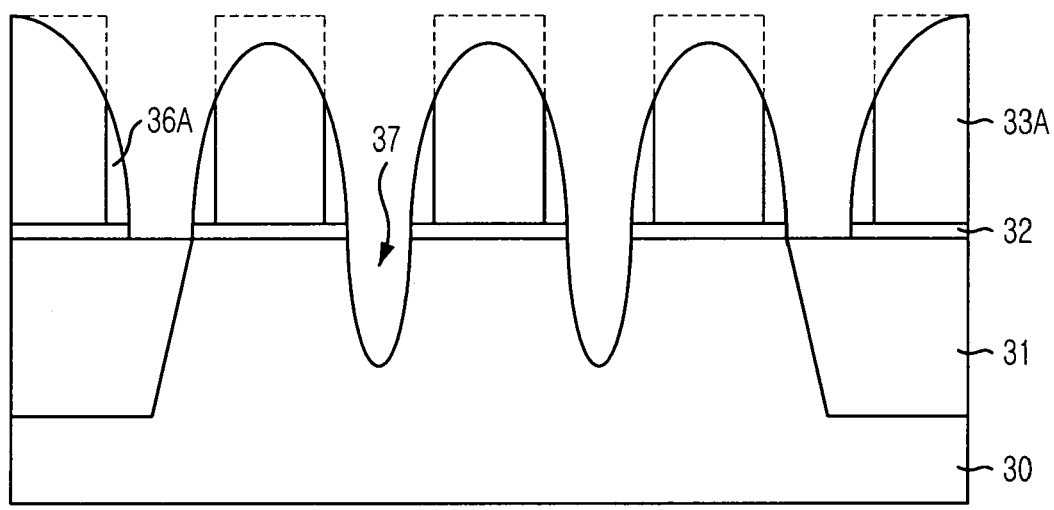

Referring to FIG. 3C, a blanket etch process is performed to simultaneously etch portions of the spacer nitride layer 36, the gate insulation layer 32 and the substrate 30 shown in FIG. 3B. From the blanket etch process, a spacer 36A is formed on sidewalls of the inter-layer insulation pattern 33A and a trench 37 is formed in the substrate 30 with a predetermined depth. Preferably, the blanket etch process proceeds by appropriately controlling a selectivity ratio between the substrate 30 and the oxide layer, i.e., the inter-layer insulation pattern 33A shown in FIG. 3B. Additionally, portions of the inter-layer insulation pattern 33A are also etched during the above blanket etch process. After the blanket etch process, an ion implantation process for controlling transistor characteristics is performed.

Figure 3D:
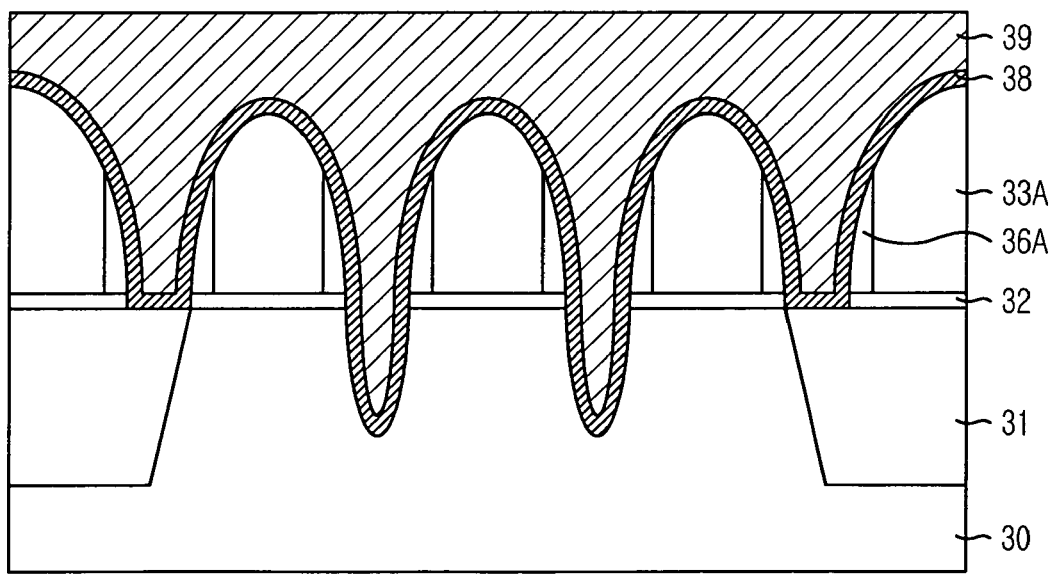

Referring to FIG. 3D, a barrier metal layer 38 is deposited along the above resulting profile containing the trench 37. Then, a tungsten layer 39 is deposited on the barrier metal layer 38 such that the tungsten layer 39 completely buries the gate regions formed in the trench 37 and between the inter-layer insulation patterns 33A.

Figure 3E:
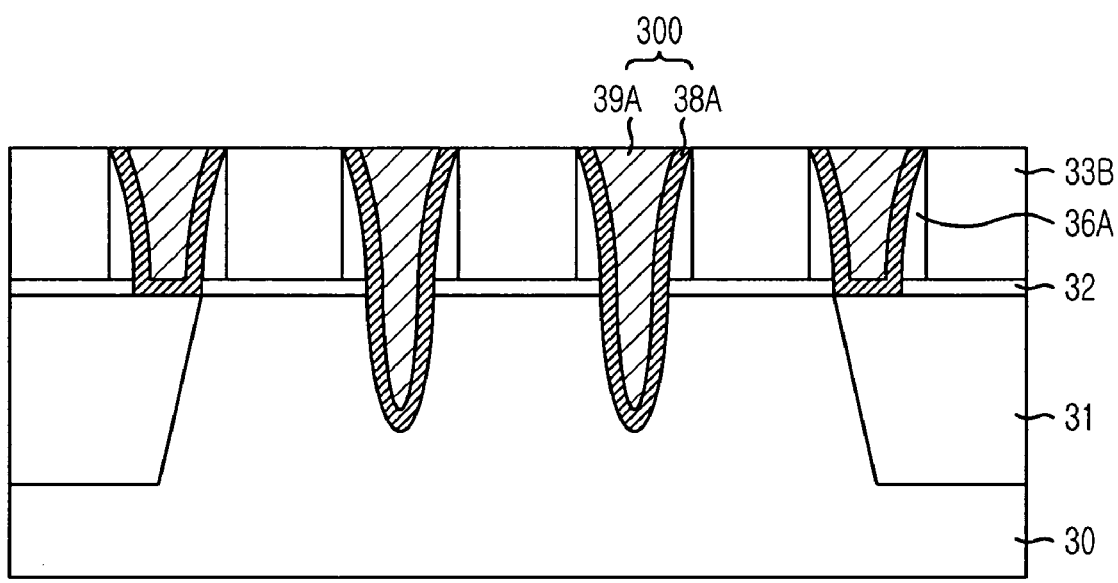

Referring to FIG. 3E, the tungsten layer 39 and the barrier metal layer 38 shown in FIG. 3D are etched by performing a chemical mechanical polishing (CMP) process which continues until a top portion of the inter-layer insulation pattern 33A is removed. More specifically, the CMP process proceeds under a target of planarizing the tungsten layer 39 and the barrier metal layer 38 until a top portion of the spacer 36A is exposed. From this CMP process, a planarized substrate structure including a planarized inter-layer insulation pattern 33B is obtained and a gate 300 including a planarized barrier metal layer 38A and a planarized tungsten layer 39A is formed. Also, a height of the gate 300 can be adjusted by appropriately controlling recipes of the CMP process.

Although not illustrated, the planarized inter-layer insulation pattern 33B is selectively removed by performing a wet etching process in which the above planarized substrate structure is dipped into a wet chemical solution. Through this selective removal of the planarized inter-layer insulation pattern 33B, a landing plug contact (LPC) hole is formed. Then, a polysilicon layer is deposited to bury the LPC hole. An etch-back process is performed to form a landing plug (LP) contacting the substrate 30.

Figure 4:
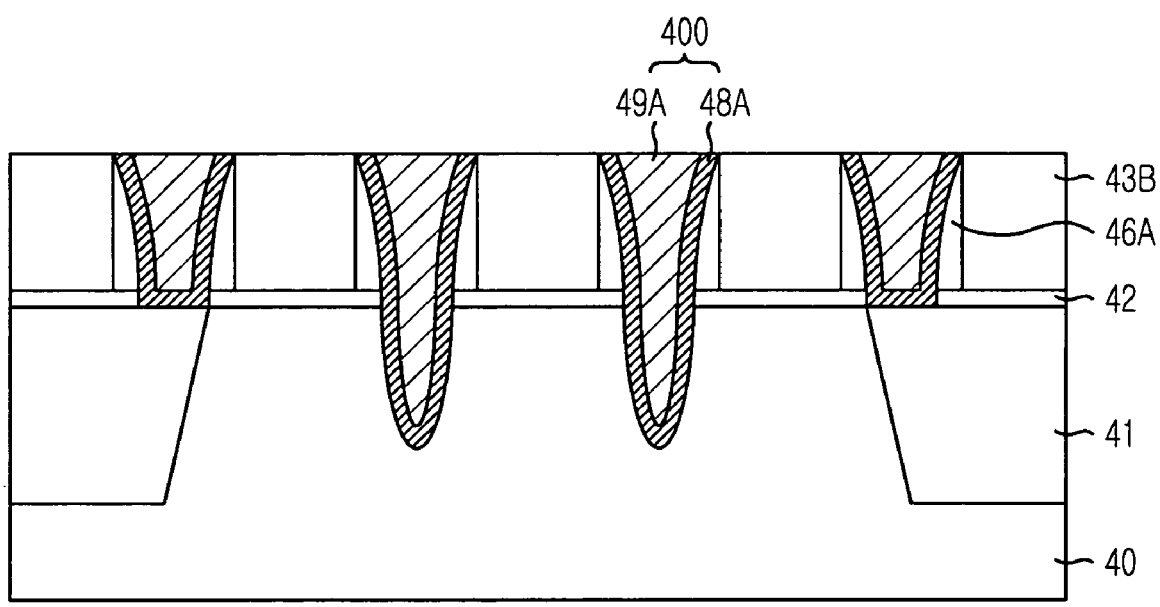
FIG. 4 is a cross-sectional view of a semiconductor device fabricated in accordance with another preferred embodiment of the present invention.

FIG. 4 is a cross-sectional view of a semiconductor device fabricated in accordance with another preferred embodiment of the present invention.

As shown, a plurality of gate insulation layers 42 are formed on a substrate 40 provided with field oxide layers 41. Also, a barrier metal layer 48A is individually formed between and below the gate insulation layers 42 in the form of a curved line. A metal layer 49A, which is made of tungsten, is formed on each of the barrier metal layers 48A. The barrier metal layer 48A and the metal layer 49A construct a gate 400. In addition, there are spacers 36A formed on a portion of each lateral side of the barrier metal layer 48A and inter-layer insulation patterns 43B formed between the spacers 46A.

In accordance with the preferred embodiments of the present invention, the inter-layer insulation layer is formed in a single layer before the formation of the gate, and then, only the inter-layer insulation layer is etched by using the photoresist pattern. As a result, it is possible to prevent the photoresist pattern from being collapsed and voids from being generated in the inter-layer insulation layer.

Also, the gate is formed by performing the CMP process proceeding after the gate material layer is filled into the gate regions formed between the trench and the inter-layer insulation pattern and between the inter-layer insulation patterns. Thus, there are not remnants remaining in the gate, further providing an effect of preventing a bridge formation phenomenon. In addition, because of the trench, a total line width of the gate is increased and thus, it is possible to secure a sufficient line width of the gate even if a pitch between the gates increases. This effect further provides improvements on a short channel effect and transistor characteristics such as a refresh characteristic more concerned in a highly integrated device.

Furthermore, there is an effect on an increase in a gate channel length as much as the length of the trench. Thus, a channel doping concentration can be reduced to provide another effect on a decrease in electric fields, which eventually attributes to an improvement on the refresh characteristic.

The present application contains subject matter related to the Korean patent application No. KR 2003-0096314, filed in the Korean Patent Office on Dec. 24, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for forming a gate in a semiconductor device, comprising the steps of:
sequentially forming a gate insulation layer and an inter-layer insulation layer on a substrate;
patterning the inter-layer insulation layer into a given configuration, thereby forming a patterned inter-layer insulation layer;
forming a nitride layer over the patterned inter-layer insulation layer and the gate insulation layer;
simultaneously etching the nitride layer, the gate insulation layer and the substrate, thereby obtaining a spacer, formed by using the etched nitride layer, on sidewalls of the patterned inter-layer insulation layer and a trench having a given depth in the substrate;
forming a conductive layer on the trench; and
planarizing the conductive layer, thereby forming the gate.

2. The method of claim 1, wherein at the step of forming the spacer and the trench, the etching proceeds by employing a blanket etch process.

3. The method of claim 1, wherein the conductive layer is made of a tungsten layer.

4. The method of claim 1, wherein the conductive layer is made of a barrier metal layer and a tungsten layer.

5. The method of claim 1, wherein the planarizing step is performed by employing a chemical mechanical polishing process.

* * * * *